(12) United States Patent
Chen et al.

(10) Patent No.: US 7,094,672 B2
(45) Date of Patent: Aug. 22, 2006

(54) METHOD FOR FORMING SELF-ALIGNED CONTACT IN SEMICONDUCTOR DEVICE

(75) Inventors: Meng-Hung Chen, Taoyuan (TW); Shian-Jyh Lin, Yonghe (TW); Chia-Sheng Yu, Banciao (TW)

(73) Assignee: Nanya Technology Corp., Taoyuan (TW)

( * ) Notice: Subject to any disclaimer, the term of this patent is extended or adjusted under 35 U.S.C. 154(b) by 0 days.

(21) Appl. No.: 10/940,772

(22) Filed: Sep. 15, 2004

(65) Prior Publication Data
US 2005/0239282 A1    Oct. 27, 2005

(30) Foreign Application Priority Data
Apr. 23, 2004    (TW) ................. 93111514 A

(51) Int. Cl.
*H01L 21/4763* (2006.01)
(52) U.S. Cl. ............... 438/586; 438/634; 438/637; 438/639; 438/640; 438/666; 438/672; 438/673; 438/738
(58) Field of Classification Search ............. 438/622, 438/634, 637, 639–640, 666, 672–673, 738, 438/586
See application file for complete search history.

(56) References Cited

U.S. PATENT DOCUMENTS

| | | | | |
|---|---|---|---|---|
| 4,997,790 A | * | 3/1991 | Woo et al. ................. | 438/586 |
| 5,902,132 A | * | 5/1999 | Mitsuhashi ................. | 438/666 |
| 6,274,426 B1 | * | 8/2001 | Lee et al. .................... | 438/253 |
| 6,528,418 B1 | * | 3/2003 | Kim et al. ................... | 438/672 |
| 6,808,984 B1 | * | 10/2004 | Chen ........................... | 438/256 |
| 2004/0203231 A1 | * | 10/2004 | Hsieh .......................... | 438/669 |

* cited by examiner

*Primary Examiner*—Lynne A. Gurley
(74) *Attorney, Agent, or Firm*—Michael Bednarek; Pillsbury Winthrop Shaw Pittman LLP

(57) ABSTRACT

A method for forming a self-aligned contact on a semiconductor substrate provided with a plurality of field-effect transistors. The method includes the steps of forming a first insulating layer that includes a nitride along a profile of a gate structure and a junction region, forming a temporary layer that has a doped oxide on the first insulting layer, removing a portion of the temporary layer by performing a selective etch of the oxide with a mask while leaving a plug portion of the temporary layer over the junction region, forming a second insulting layer that has an undoped oxide in a region where the portion of the temporary layer is removed, removing the plug portion by performing a selective etch of the undoped oxide to form a contact hole, removing a portion of the first insulating layer at a bottom of the contact hole, and forming a conductive contact ins the contact hole.

18 Claims, 5 Drawing Sheets

METHOD FOR FORMING SELF-ALIGNED CONTACT IN SEMICONDUCTOR DEVICE

BACKGROUND OF THE INVENTION

1. Field of the Invention

The present invention relates to a method of fabricating a semiconductor device, and particularly to a method of fabricating a memory array using a self-aligned contact (SAC) technique.

2. Description of the Related Art

In the fabrication of a semiconductor device, an exemplary application of the self-aligned contact (SAC) technique is to form a contact between a pair of adjacent wordlines (gate structures of the field-effect transistors) in a memory array so as to electrically connect a source/drain region (junction region) of the transistor to a bitline.

A typical method for forming a self-aligned contact according to the prior art will be explained with reference to FIGS. 1(a) and 1(b).

First, as shown in FIG. 1(a), gate structures 101 for transistors are provided on a substrate 100, and a source/drain region (junction region) 110 is formed in the substrate by using an ion implantation technique. Typically, each of the gate structures 101 includes a polysilicon layer 106 and a tungsten silicide layer 104 atop the polysilicon layer 106. Further, a cap layer 102 is formed to cap the tungsten silicide layer 104, and two spacers 108 are respectively provided along both side walls of the stack structure formed by the layers 102, 104 and 106. The cap layer 102 and the spacers 108 are all made of silicon nitride, which not only prevents the gate from being etched but also acts as a insulator between the gate and a contact.

Next, a thick oxide insulative material, for example, borophosphosilicate glass (BPSG), is filled in the memory array region, forming an oxide layer (insulating layer) 112.

Then, as shown in FIG. 1(b), a photoresist layer is coated on the surface of the oxide layer 112 to form a mask 114 defined with a predetermined pattern exposing the region where the contact is to be formed. Later, the oxide layer 112 is etched through to the junction region 110 in the substrate 100 to form a contact hole 116 by using an etch process highly selective for the oxide relative to the nitride, i.e., an etch process in which an oxide etch rate is much greater than a nitride etch rate.

Finally, metallic contact material is filled into the contact hole 116 to form a contact for an electric connection between the junction region and a bitline.

Although the cap layer 102 and the spacer 108 will be exposed to the enchant during the formation of the contact hole 115, it is etched very slowly since the SAC oxide etch is highly selective to nitride. Therefore, the SAC technique is advantageous in that it allows the dimension of the contact hole to be wider than the width between two adjacent gate structures and that it allows the mask 114 for exposing the contact hole to be less precisely aligned.

However, in a semiconductor process having a feature size of 70 nm or less, the following problems will occur when adopting the conventional SAC technique.

First, during the formation of the contact hole, the corner portion of the nitride (cap layer 102 and spacer 108), which has a geometric shape apt to be etched, is exposed to the etchant for a long time since the oxide layer to be etched through has a relative large depth. Therefore, it is difficult to prevent over-etching of the nitride. This causes exposure of the gate to the contact, leading to short-circuiting between the wordline and the bitline.

Second, the etchant used in the formation of the contact hole also erodes the junction region in the substrate. When the feature size is reduced, junction depth becomes shallow; for example, for the 70 nm process, the junction depth is only about 200 Å. Therefore, loss of the silicon substrate results in a considerable junction leakage.

SUMMARY OF THE INVENTION

It is an object of the invention to provide a method for forming a self-aligned contact in a semiconductor device, which is adapted for use in fabrication of memory arrays to eliminate the possibility of over-etching of a nitride cap layer and spacers to thereby prevent short-circuiting between a wordline and a bitline.

Another object of the invention is to provide a method for forming a self-aligned contact in a semiconductor device, which is adapted for use in fabrication of memory arrays to reduce the junction loss caused during the formation of a contact hole to thereby improve the junction leakage.

A further object of the invention is to provide a method for forming a self-aligned contact in a semiconductor device, which is adapted for use in fabrication of memory arrays to eliminate the possibility of joining of adjacent contacts even if voids are produced in the inter-layer dielectric (ILD) during the process to thereby prevent short-circuiting between bitlines.

To achieve the above objects, the method for forming a self-aligned contact in a semiconductor device comprise the steps of: forming a first insulating layer comprising a nitride along a profile of a gate structure and a junction region on a semiconductor substrate provided with a plurality of field-effect transistors; forming a temporary layer comprising a doped oxide one the first insulating layer; removing a portion of the temporary layer by performing a selective etch of the oxide with a mask while leaving a plug portion of the temporary layer over the junction region; forming a second insulating layer comprising an undoped oxide in a region where the portion of the temporary layer is removed; removing the plug portion by performing a selective etch of the doped oxide to form a contact hole; removing portion of the first insulating layer at a bottom of the contact hole; and forming a conductive contact in the contact hole.

In the above, method, the step of removing the plug portion is performed by etching with an etchant of vapor hydrofluoric acid (HF). This is because an etch rate of the doped oxide by the vapor hydrofluoric acid is much greater than both an etch rate of the undoped oxide and an etch rate of the nitride.

Further, in the above method, a third insulating layer comprising a nitride may be formed on side walls of the plug portion of the temporary layer after the selective etch step.

As described above, in the present invention, the contact hole is formed by removing the plug portion of doped oxide with the vapor hydrofluoric acid. Therefore, undesired over-etching at a corner portion of the nitride insulating layer for protecting the gate structure can be avoided, and thus short-circuiting between the wordline and the bitline can be effectively prevented. Moreover, since the vapor hydrofluoric acid does not erode the nitride insulating layer, it is possible to ensure a junction loss of less than 50 Å, which effectively improves the problem of junction leakage. In addition, when the nitride insulating layer is formed on side walls of the plug portion, undesired joining of adjacent contacts can be avoided and thus short-circuiting between bitlines can be effectively prevented.

BRIEF DESCRIPTION OF THE DRAWINGS

Objects and advantages of the present invention will be fully understood from the detailed description to follow taken in conjunction with the example as illustrated in the accompanying drawings, wherein.

DETAILED DESCRIPTION OF THE PREFERRED EMBODIMENT

The method of forming a self-aligned contact in a semiconductor device according to the present invention will be explained with reference to the cross-sectional views in FIGS. 2(a) to 2(h).

According to a preferred example of the present invention, bitline contacts in a memory array area of a memory device and other contacts required in a periphery area can be formed in the same process.

Figure 2A:
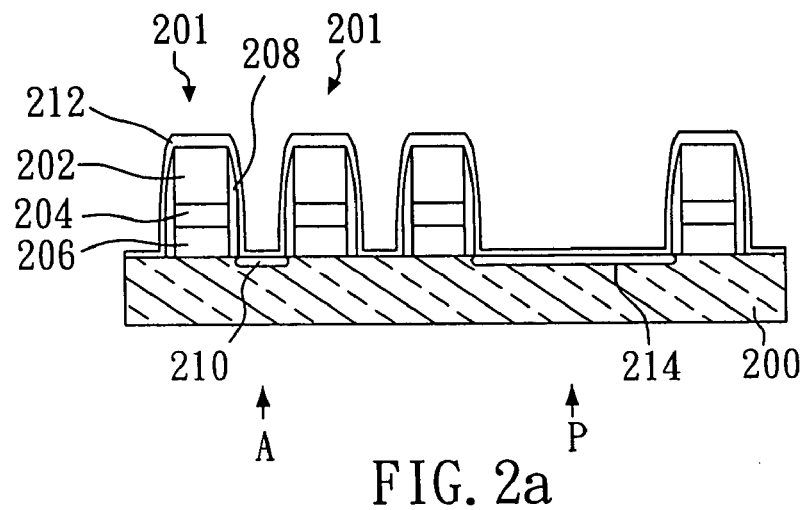
FIGS. 2(a) to 2(k) are cross-sectional views for explaining the process of the self-aligned contact technique according to the present invention.

In FIG. 2(a), the memory array area is on the left side, designated by an arrow A, while the periphery area is on the right side, designated by an arrow P.

Figure 1A:
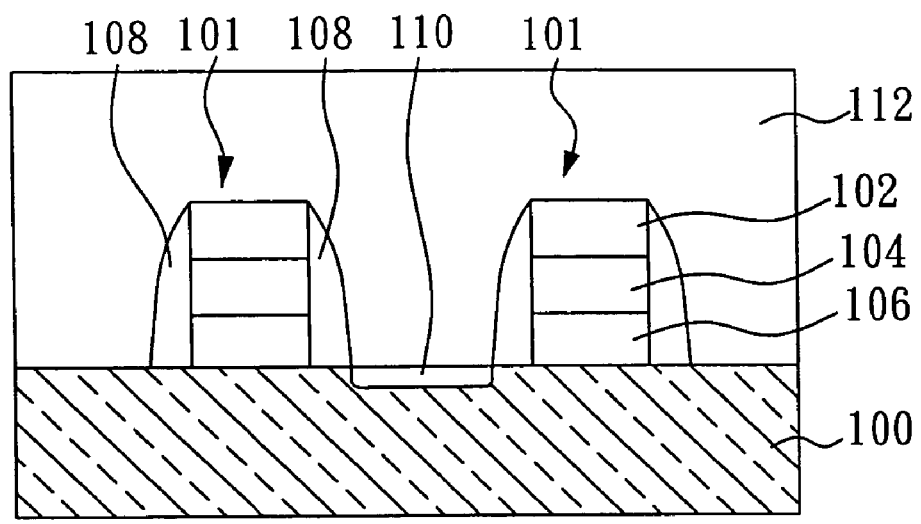
FIGS. 1(a) and 1(b) are cross-sectional views for explaining the process of the self-aligned contact technique according to the prior art.
Figure 1B:
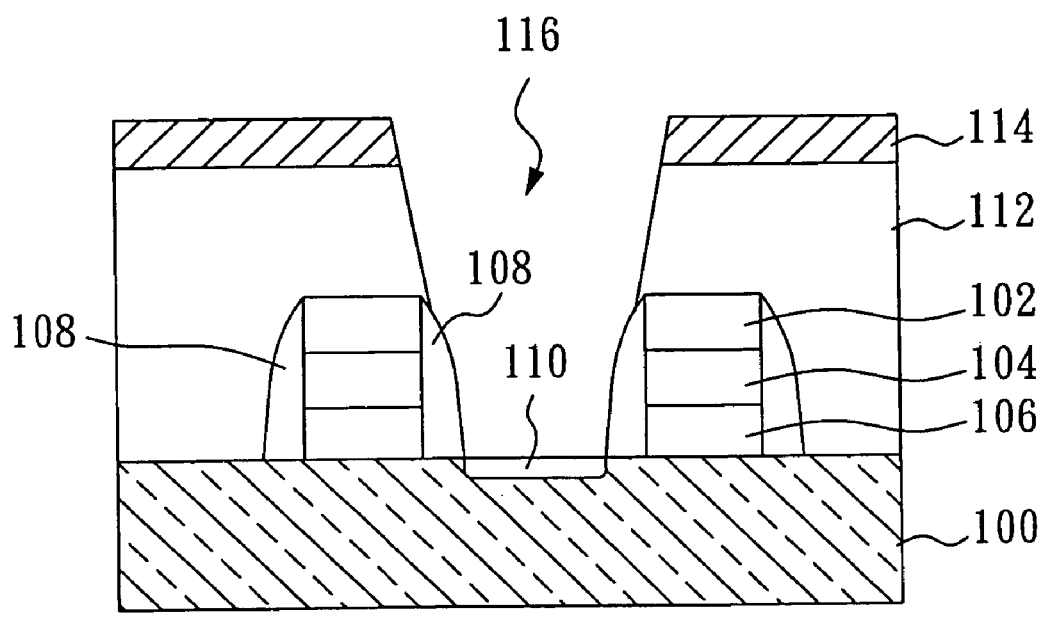

According to the preferred example of the present invention, first, a plurality of gate structures 201 are provided on a substrate 200, and junction regions 210 and 214 are formed in the substrate 200 by ion implantation. Similar to the prior art in FIG. 1, the gate structure 201 includes a polysilicon (poly-Si) layer 206 and a tungsten silicide (WSix) layer 204 on the polysilicon layer 206. The tungsten silicide layer 204 is further capped with a silicon nitride (SiN) cap layer 202, and, two silicon nitride (SiN) spacers 208 are respectively provided along the side walls of the stack structure formed by the three layers 202, 204 and 206.

Then, a thin silicon nitride (SiN) insulating layer is deposited on the entire wafer, forming a nitride insulating layer (the first insulating layer) 212.

Figure 2B:
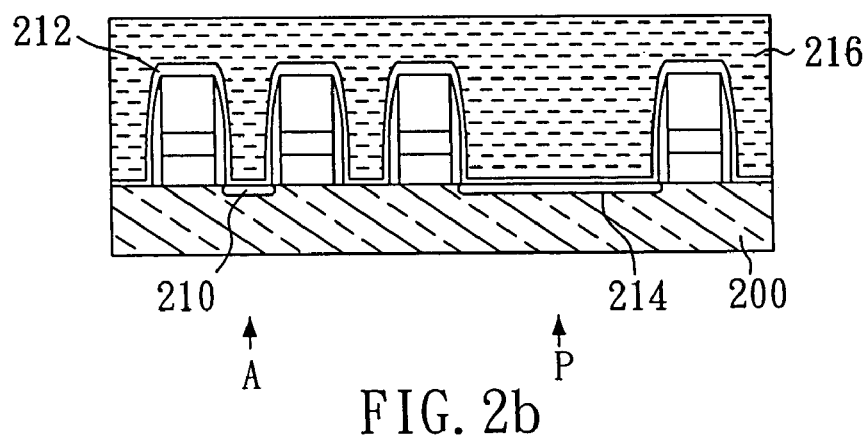

Next, as illustrated in FIG. 2(b), a borophosphosilicate glass layer having a thickness sufficient to cover all gate structures, for example, a thickness of about 2500~3000 Å, is deposited on the entire wafer, forming a temporary layer 216. The BPSG is an oxide doped with boron and phosphorous, and thus this temporary layer 216 is also referred to as a doped oxide layer. Then, the upper surface of the temporary layer 216 is planarized by using a chemical mechanical planarization (CMP) process.

Figure 2C:
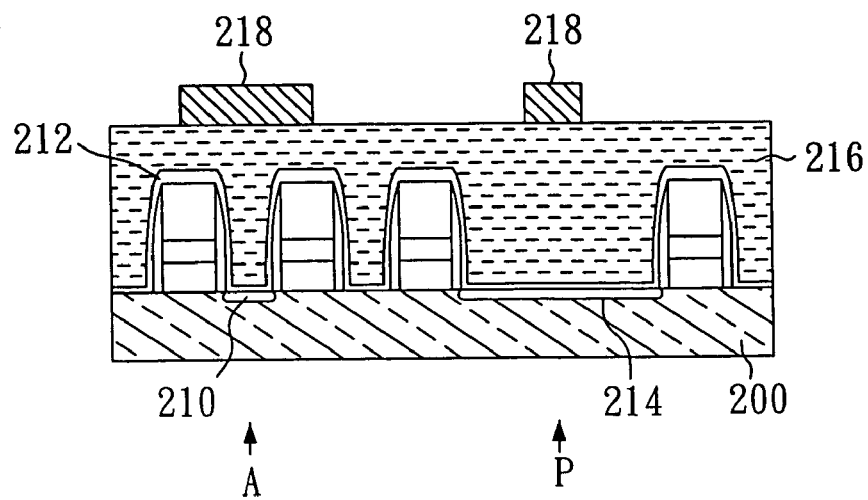

As illustrated in FIG. 2(c), after planarization, a photoresist layer is coated on the planarized surface of the temporary layer 216 and is patterned to form a mask 218 having a predetermined pattern covering only the regions where contacts are to be formed.

Figure 2D:
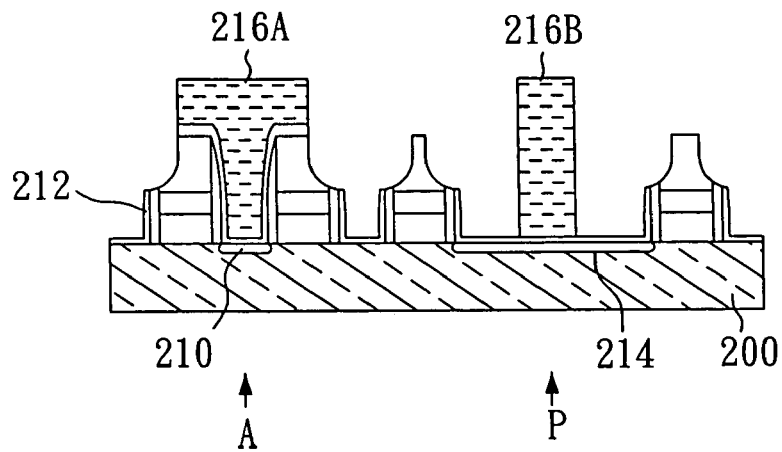

Next, as illustrated in FIG. 2(d), a portion of the temporary layer 216 which is not covered by the mask 218 is etched away in using a selective etching technique known in the art, forming plug portions 216A and 216B. In selective etching of this step, an oxide etch rate is much higher than a nitride etch rate, and thus the substrate 200 can be protected by the nitride insulating layer 212 from erosion.

Figure 2E:
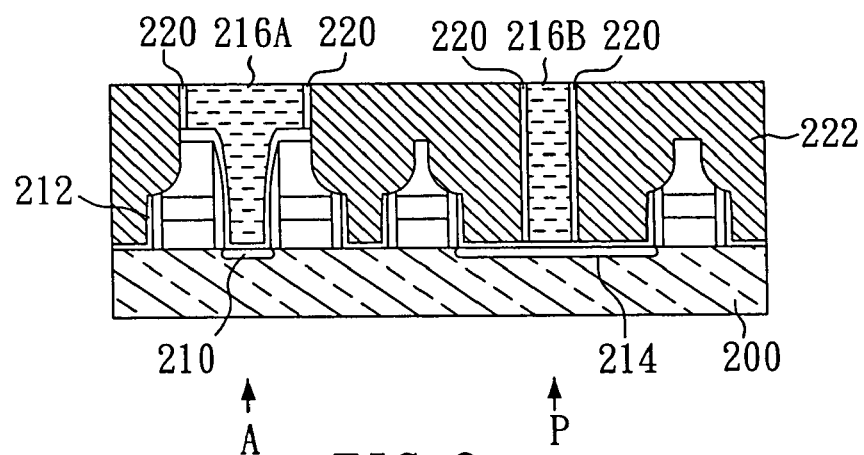

Next, as illustrated in FIG. 2(e), a thin silicon nitride (SiN) insulating layer having a thickness of about 100 Å is deposited on side walls of the plug portions 216A and 216B forming a nitride insulating layer (the third insulating layer) 220. The nitride insulating layer 220 serves to protect the bitline contacts, which are to be formed in the later steps, so as to prevent short-circuiting between bitlines resulting from joining of adjacent contacts caused by the voids in the inter-layer dielectric (ILD). In the case that the inter-layer dielectric is supposed to be void-free, this step can be eliminated.

Next, in the region where the portion of the temporary layer 216 is etched away in the step illustrated in FIG. 2(d), an undoped silicon dioxide ($SiO_2$) layer having a width of about 5000 Å is deposited by using, for example, high density plasma chemical vapor deposition (HDP CVD), forming an undoped oxide layer (the second insulating layer) 222. Then, the undoped oxide layer 222 is planarized by using CMP process to expose the upper surface of the plug portions 216A and 216B and the nitride insulating layer 220.

Figure 2F:
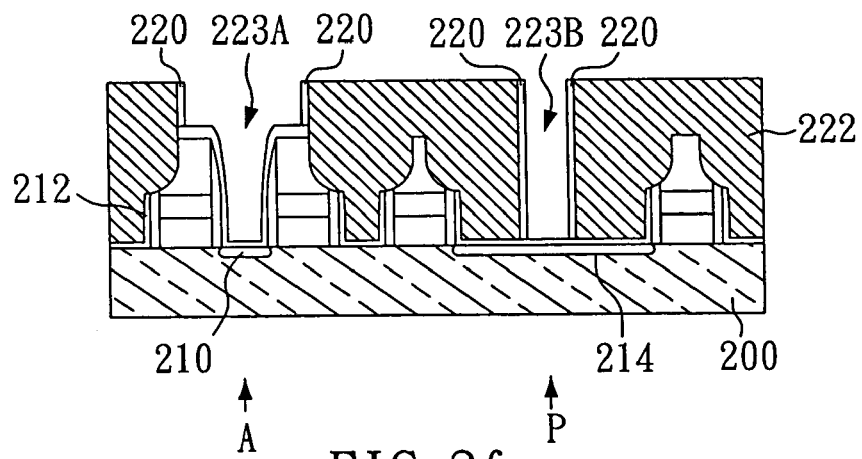

Next, as illustrated in FIG. 2(f), a selective etching process is carried out with vapor hydrofluoric acid (VHF) as an etchant. The vapor hydrofluoric acid is excellent in selective etching for doped oxide; that is, an etch rate of the doped oxide is much higher than both an etch rate of the undoped and an etch rate of the nitride. Therefore, the plug portions 216A and 216B can be removed to form contact holes 223A and 223B by using the vapor hydrofluoric acid while leaving the nitride uneroded. Accordingly, there will be no loss to the SiN layer 220/212, and the gate structure 201 will not be exposed to the contact hole 223A.

Figure 2G:
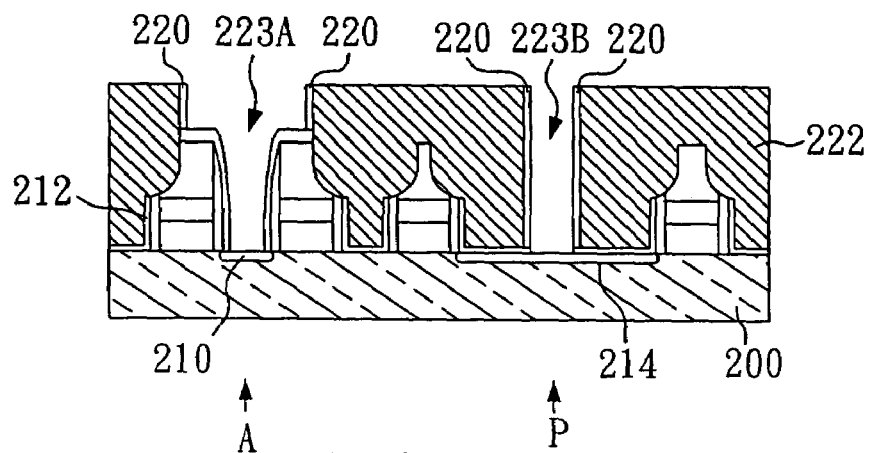

Next, as illustrated in FIG. 2(g), a portion of the nitride insulating layer 212 at the bottom of the contact holes 223A and 223B is removed. Since the nitride insulating layer 212 has excellent thickness uniformity and the vapor hydrofluoric acid does not erode nitride at all, the nitride insulating layer 212 can be etched away in a good controlled over etch. For this reason, loss of the junction regions 210 and 214 in the substrate 200 can be easily controlled to be less than 50 Å in this step.

Figure 2H:
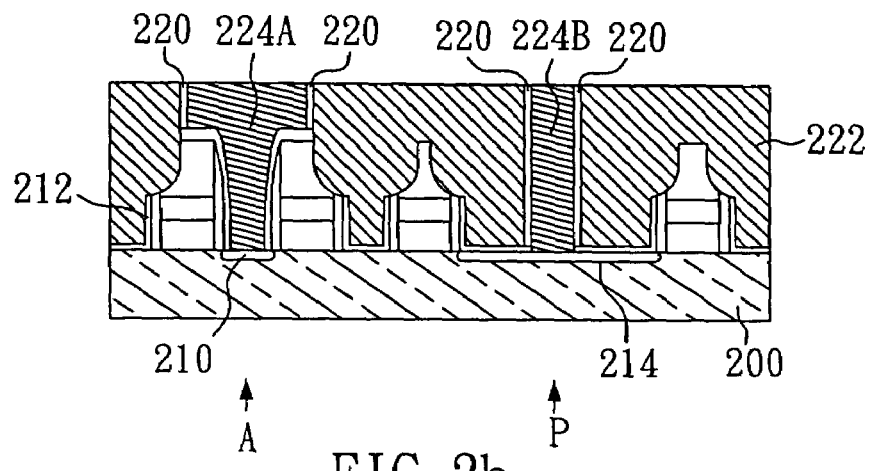

Next, as illustrated in FIG. 2(h), a conductive material is filled into the contact holes 223A and 223B and then planarized with CMP process to form a bitline contact 224A in the memory array area and a contact 224B required in the periphery area, respectively.

The method of forming a bitline and other wires required in the periphery area will be explained with reference to the cross-sectional views in FIGS. 2(i) to 2(k).

Figure 2I:
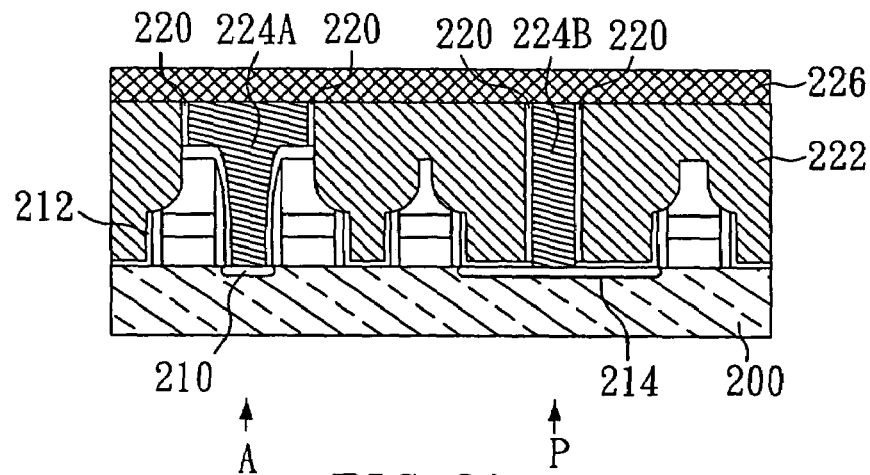
Figure 2J:
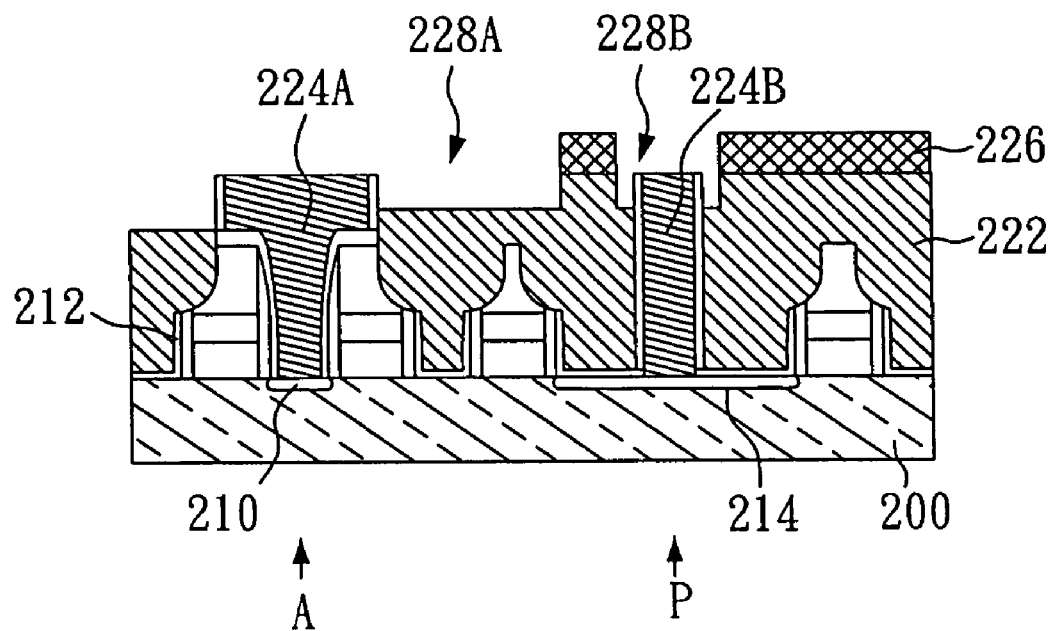
Figure 2K:
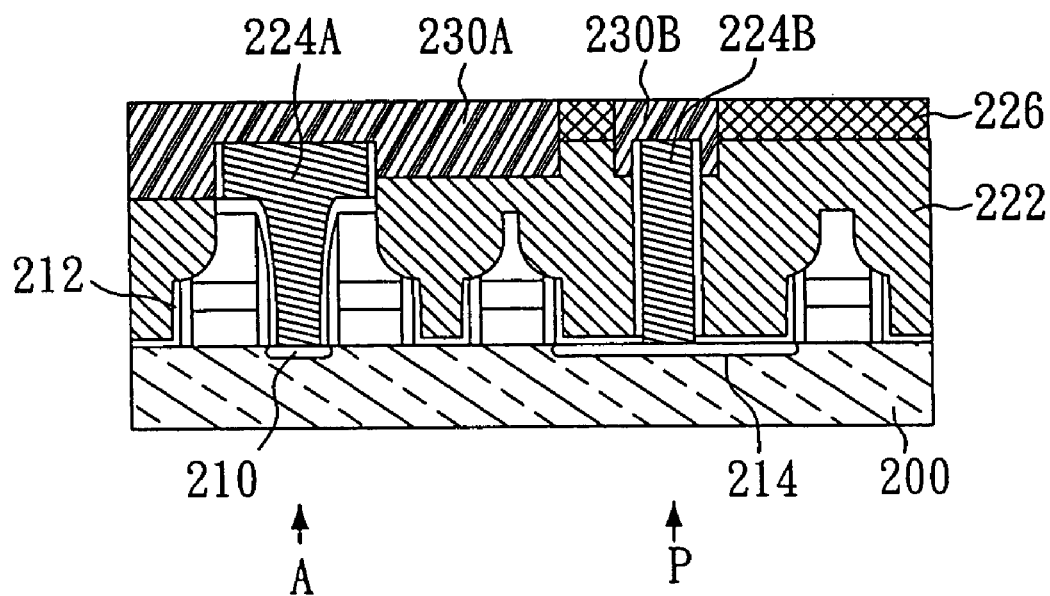

First, as illustrated in FIG. 2(i), a TEOS (tetraethoxysilane) layer 226 having a thickness of about 2000 Å is deposited on the entire wafer. Next, as illustrated in FIG. 2(j), the TEOS layer 226 is etched for a depth of about 2500~3000 Å in the regions 228A and 228B where a bitline and a wire is to be formed, thus exposing the contacts 224A and 224B, respectively. Finally, as illustrated in FIG. 2(k), a conductive material is filled into the regions 228A and 228B and planarized by using CMP process, forming a bitline 230A in the memory array area and a wire 230B in the periphery area.

While the present invention has been described with reference to the preferred example thereof, it is to be understood that the invention should not be considered as limited thereby. Various modifications and changes could be conceived of by those skilled in the art without departuring from the scope of the present invention, which is indicated by the appended claims.

What is claimed is:

1. A method for forming a self-aligned contact in a semiconductor device, comprising the steps of:
   (a) providing a substrate having at least one gate structure and at least one junction region adjacent said gate structure;
   (b) forming a first insulating layer along a profile of said gate structure and said junction region;
   (c) forming a temporary layer on said first insulating layer;
   (d) selectively removing a portion of said temporary layer while leaving a plug portion of said temporary layer over said junction region;
   (e) forming a second insulating layer in a region where said portion of said temporary layer is removed;
   (f) removing said plug portion to form a contact hole;
   (g) removing a portion of said first insulating layer at a bottom of said contact hole; and
   (h) forming a conductive contact in said contact hole;
   wherein a third insulating layer is formed on side walls of said plug portion after said step (d);
   wherein said third insulating layer is made of material different from that of said second insulating layer.

2. The method for forming a self-aligned contact in a semiconductor device of claim 1, wherein said first insulating layer is made of silicon nitride (SiN).

3. The method for forming a self-aligned contact in a semiconductor device of claim 1, wherein said temporary layer is made of borophosphosilicate glass (BPSG).

4. The method for forming a self-aligned contact in a semiconductor device of claim 1, wherein said temporary layer has a thickness in a range of 2500~3000 Å.

5. The method for forming a self-aligned contact in a semiconductor device of claim 1, wherein said step (d) comprises the steps of:
   forming a mask having a predetermined pattern on said temporary layer; and
   removing a portion of said temporary layer not covered by said mask by using a selective etch process where an etch rate of said temporary layer is higher than an etch rate of said first insulating layer while leaving a plug portion of said temporary layer over said junction region.

6. The method for forming a self-aligned contact in a semiconductor device of claim 1, wherein said third insulating layer is made of silicon nitride (SiN).

7. The method for forming a self-aligned contact in a semiconductor device of claim 1, wherein said second insulating layer is made of undoped silicon dioxide ($SiO_2$).

8. The method for forming a self-aligned contact in a semiconductor device of claim 1, wherein said step (f) comprises the step of:
   removing said plug portion by using a selective etch process where an etch rate of said temporary layer is higher than both an etch rate of said first insulating layer and an etch rate of said second insulating layer to form a contact hole.

9. The method for forming a self-aligned contact in a semiconductor device of claim 8, wherein said selective etch process is performed by using an etchant comprising vapor hydrofluoric acid (Vapor HF).

10. A method for forming a self-aligned contact in a semiconductor device, comprising the steps of:
    (a) providing a substrate having at least one gate structure and at least one junction region adjacent said gate structure;
    (b) forming a first insulating layer comprising a nitride along a profile of said gate structure and said junction region;
    (c) forming a temporary layer comprising a doped oxide on said first insulating layer;
    (d) removing a portion of said temporary layer by performing a selective etch of the oxide with a mask while leaving a plug portion of said temporary layer over said junction region;
    (e) forming a second insulating layer comprising an undoped oxide in a region where said portion of said temporary layer is removed;
    (f) removing said plug portion by performing a selective etch of the doped oxide to form a contact hole;
    (g) removing a portion of said first insulating layer at a bottom of said contact hole; and
    (h) forming a conductive contact in said contact hole;
    wherein a third insulating layer comprising a nitride is formed on side walls of said plug portion after said step (d).

11. The method for forming a self-aligned contact in a semiconductor device of claim 10, wherein said first insulating layer comprises silicon nitride (SiN).

12. The method for forming a self-aligned contact in a semiconductor device of claim 10, wherein said temporary layer comprises borophosphosilicate glass (BPSG).

13. The method for forming a self-aligned contact in a semiconductor device of claim 10, wherein said temporary layer has a thickness in a range of 2500~3000 Å.

14. The method for forming a self-aligned contact in a semiconductor device of claim 10, wherein said step (d) comprises the steps of:
    forming a mask having a predetermined pattern on said temporary layer; and
    removing a portion of said temporary layer not covered by said mask by using a selective etch process where an etch rate of the oxide is higher than an etch rate of the nitride while leaving a plug portion of said temporary layer over said junction region.

15. The method for forming a self-aligned contact in a semiconductor device of claim 10, wherein said third insulating layer comprises silicon nitride (SiN).

16. The method for forming a self-aligned contact in a semiconductor device of claim 10, wherein said second insulating layer comprises undoped silicon dioxide ($SiO_2$).

17. The method for forming a self-aligned contact in a semiconductor device of claim 10, wherein said step (f) comprises the step of:
    removing said plug portion by using a selective etch process where an etch rate of the doped oxide is higher than both an etch rate of the undoped oxide and an etch rate of the nitride to form a contact hole.

18. The method for forming a self-aligned contact in a semiconductor device of claim 17, wherein said selective etch process is performed by using an etchant comprising vapor hydrofluoric acid (Vapor HF).

* * * * *